(12) United States Patent
Miyata et al.

(10) Patent No.: US 12,191,381 B2
(45) Date of Patent: Jan. 7, 2025

(54) SEMICONDUCTOR DEVICE

(71) Applicant: DENSO CORPORATION, Kariya (JP)

(72) Inventors: Masanori Miyata, Kariya (JP); Yuuma Kagata, Kariya (JP); Yuki Yakushigawa, Seto (JP); Masaru Senoo, Okazaki (JP); Hiroshi Hosokawa, Nagoya (JP); Takaya Nagai, Toyota (JP)

(73) Assignee: DENSO CORPORATION, Kariya (JP)

( * ) Notice: Subject to any disclaimer, the term of this patent is extended or adjusted under 35 U.S.C. 154(b) by 391 days.

(21) Appl. No.: 17/682,395

(22) Filed: Feb. 28, 2022

(65) Prior Publication Data

US 2022/0181471 A1 Jun. 9, 2022

Related U.S. Application Data

(63) Continuation of application No. PCT/JP2020/033285, filed on Sep. 2, 2020.

(30) Foreign Application Priority Data

Sep. 4, 2019 (JP) .................................. 2019-161392

(51) Int. Cl.
*H01L 29/739* (2006.01)
*H01L 29/10* (2006.01)
*H01L 29/861* (2006.01)

(52) U.S. Cl.
CPC ...... *H01L 29/7393* (2013.01); *H01L 29/1095* (2013.01); *H01L 29/861* (2013.01)

(58) Field of Classification Search
CPC ............. H01L 29/7393; H01L 29/1095; H01L 29/861; H01L 29/42368; H01L 29/0603; H01L 29/7397; H01L 29/407; H01L 21/8234; H01L 27/06; H01L 27/088; H01L 29/78
See application file for complete search history.

(56) References Cited

U.S. PATENT DOCUMENTS

| | | |
|---|---|---|
| 2014/0048847 A1 | 2/2014 | Yamashita et al. |
| 2015/0295042 A1 | 10/2015 | Kameyama et al. |
| 2016/0260710 A1* | 9/2016 | Okawara ............. H01L 29/0623 |
| 2016/0351561 A1 | 12/2016 | Senoo |
| 2017/0084610 A1* | 3/2017 | Kouno ................ H01L 29/0696 |
| 2017/0084611 A1* | 3/2017 | Iwasaki ............... H01L 29/7397 |
| 2017/0098700 A1 | 4/2017 | Yamashita et al. |
| 2018/0197977 A1 | 7/2018 | Kouno |
| 2018/0374947 A1 | 12/2018 | Yamashita et al. |
| 2019/0252533 A1* | 8/2019 | Naito .................. H01L 29/0615 |
| 2019/0252534 A1 | 8/2019 | Murakawa et al. |

FOREIGN PATENT DOCUMENTS

| | | | |
|---|---|---|---|
| JP | 2011-238975 A | | 11/2011 |
| JP | WO 2018/220879 | * | 12/2011 |

* cited by examiner

*Primary Examiner* — Yasser A Abdelaziez
(74) *Attorney, Agent, or Firm* — Posz Law Group, PLC (57) ABSTRACT

A semiconductor device includes an IGBT region in which an IGBT element is formed and an FWD region in which an FWD element is formed. The IGBT region includes a first region and a second region different from the first region. The FWD region and the first region of the IGBT region have a carrier extraction portion that facilitates extraction of carriers injected from a second electrode compared to the second region when a forward bias for causing the FWD element to operate as a diode is applied between a first electrode and the second electrode.

5 Claims, 8 Drawing Sheets

SEMICONDUCTOR DEVICE

CROSS REFERENCE TO RELATED APPLICATIONS

The present application is a continuation application of International Patent Application No. PCT/JP2020/033285 filed on Sep. 2, 2020, which designated the U.S. and claims the benefit of priority from Japanese Patent Application No. 2019-161392 filed on Sep. 4, 2019. The entire disclosures of all of the above applications are incorporated herein by reference.

TECHNICAL FIELD

The present disclosure relates to a semiconductor device having an insulated gate bipolar transistor (IGBT) region in which an IGBT element having an insulated gate structure is formed and a free wheel diode (FWD) region in which an FWD element is formed.

BACKGROUND

Conventionally, in semiconductor devices having an IGBT region and an FWD region, a semiconductor device having a reduced switching loss of an FWD element has been proposed.

SUMMARY

The present disclosure provides a semiconductor device having an IGBT region in which an IGBT element is formed and an FWD region in which an FWD element is formed. The IGBT region has a first region and a second region different from the first region. The FWD region and the first region of the IGBT region have a carrier extraction portion that facilitates extraction of carriers injected from a second electrode compared to the second region when a forward bias for causing the FWD element to operate as a diode is applied between a first electrode and the second electrode.

BRIEF DESCRIPTION OF DRAWINGS

Objects, features and advantages of the present disclosure will become apparent from the following detailed description made with reference to the accompanying drawings. In the drawings.

DETAILED DESCRIPTION

A semiconductor device according an example has an IGBT region and an FWD region. The semiconductor device has a semiconductor substrate including an $N^-$ type drift layer, and a base layer is formed on the drift layer. In the IGBT region and the FWD region, multiple trenches are formed so as to penetrate the base layer. In each of the trenches, a gate insulating film is formed so as to cover a wall surface, and a gate electrode is formed on the gate insulating film. Further, in the IGBT region, an $N^+$ type emitter region is formed so as to be in contact with the trench. On a front surface side of the semiconductor substrate close to the base layer, an upper electrode electrically connected to the base layer and the emitter region is formed.

On a rear surface side of the semiconductor substrate opposite from the front surface, a P type collector layer and an N type cathode layer are formed, and a lower electrode electrically connected to the collector layer and the cathode layer is formed. In the semiconductor device, a region where the collector layer is formed on the rear surface side of the semiconductor substrate is the IGBT region, and a region where the cathode layer is formed on the rear surface side of the semiconductor substrate is the FWD region.

Further, an N type barrier region is formed between the drift layer and the base layer. In the base layer, multiple pillar regions are formed from the front surface of the semiconductor substrate to reach the barrier region, and the pillar regions are also connected to the upper electrode. The pillar regions are formed between adjacent trenches, respectively, and are formed over the entire region of the IGBT region and the FWD region.

In the above-described semiconductor device, the formation of the barrier region and the pillar regions suppresses the injection of holes when the FWD region is operated as a diode. Thus, a recovery current can be reduced and a recovery time can be shortened. Therefore, a switching loss can be reduced.

However, as a result of studies by the present inventors, it has been confirmed that a short-circuit tolerance may decrease in the above-described semiconductor device.

A semiconductor device according to an aspect of the present disclosure has an IGBT region in which an IGBT element is formed and an FWD region in which an FWD element is formed. The semiconductor device includes a semiconductor substrate including a drift layer of a first conductivity type, a base layer of a second conductivity type disposed in a surface layer portion of the drift layer, an emitter region of the first conductivity type disposed in a surface layer portion of the base layer in the IGBT region to be apart from the drift layer and having a higher impurity concentration than the drift layer, a collector layer of the second conductivity type disposed on a side of the drift layer opposite from the base layer in the IGBT region, and a cathode layer of the first conductivity type disposed on the side of the drift layer opposite from the base layer in the FWD region. The semiconductor device further includes a gate insulating film disposed on a surface of the base layer located between the emitter region and the drift layer, a gate electrode disposed on the gate insulating film, a first electrode electrically connected to the base layer and the emitter region, and a second electrode electrically connected to the collector layer and the cathode layer. The IGBT region has a first region and a second region different from the first region. Each of the FWD region and the first region of the IGBT region has a carrier extraction portion that facilitates extraction of carriers injected from the second electrode compared to the second region when a forward bias for causing the FWD element to operate as a diode is applied between the first electrode and the second electrode.

According to the above configuration, a switching loss can be reduced by the FWD region and the first region each having the carrier extraction portion. Further, the second region without the carrier extraction portion can suppress a decrease in short-circuit tolerance.

The following describes embodiments of the present disclosure with reference to the drawings. In the following embodiments, the same or equivalent parts are denoted by the same reference numerals.

First Embodiment

A first embodiment will be described with reference to the drawings. A semiconductor device according to the present embodiment is preferably used as a power switching element used in power supply circuits such as inverters and DC/DC converters, for example.

Figure 1:
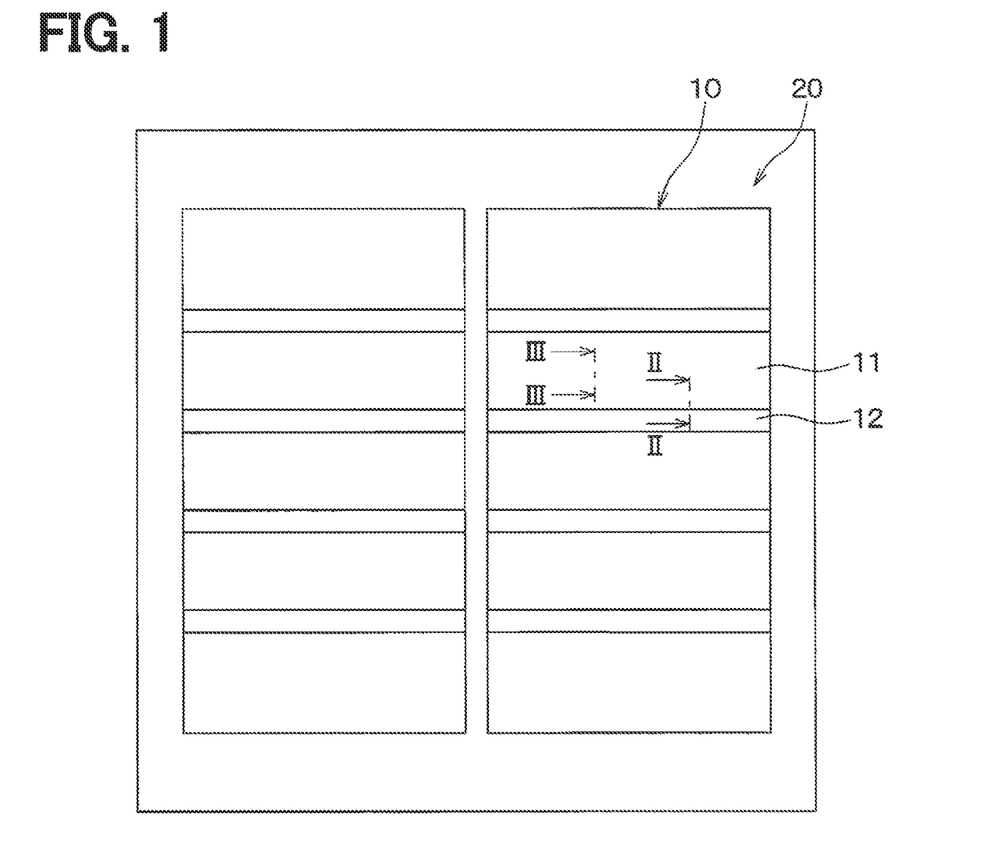
FIG. 1 is a plan view of a semiconductor device according to a first embodiment.

As shown in FIG. 1, the semiconductor device includes cell regions 10 and an outer peripheral region 20 surrounding the cell regions 10. The semiconductor device of the present embodiment has two cell regions 10. Each of the cell regions 10 is formed with IGBT regions 11 in which IGBT elements are formed and FWD regions 12 in which the FWD elements are formed. The FWD regions 12 are disposed adjacent to the IGBT regions 11. In other words, the semiconductor device according to the present embodiment has a reverse conducting (RC) IGBT in which the IGBT regions 11 and the FWD regions 12 are formed in the same chip.

In the present embodiment, the IGBT regions 11 and the FWD regions 12 are alternately formed along one direction in the respective cell regions 10. That is, the IGBT regions 11 and the FWD regions 12 are alternately formed along one direction in a plane direction of a semiconductor substrate 30, which will be described later. Specifically, each of the IGBT regions 11 and the FWD regions 12 is a rectangular region having a longitudinal direction, and the IGBT regions 11 and the FWD regions 12 are alternately formed along a direction intersecting with the longitudinal direction. The IGBT regions 11 and the FWD regions 12 are alternately arranged so that the IGBT regions 11 are positioned at both ends in the arrangement direction.

In FIG. 1, the IGBT regions 11 and the FWD regions 12 each have a rectangular shape whose longitudinal direction is lateral direction of a paper surface, and are alternately formed along a vertical direction of the paper surface. Hereinafter, in the IGBT regions 11 and the FWD regions 12, the arrangement direction of the IGBT region 11 and the FWD region 12 is also referred to as a width direction, and a length along the arrangement direction of the IGBT regions 11 and the FWD regions 12 is also referred to as a width. In the present embodiment, each of the IGBT regions 11 has a width of 800 μm, and each of the FWD regions 12 has a width of 250 μm.

Hereinafter, a specific configuration of the semiconductor device of the present embodiment will be described.

Figure 2:
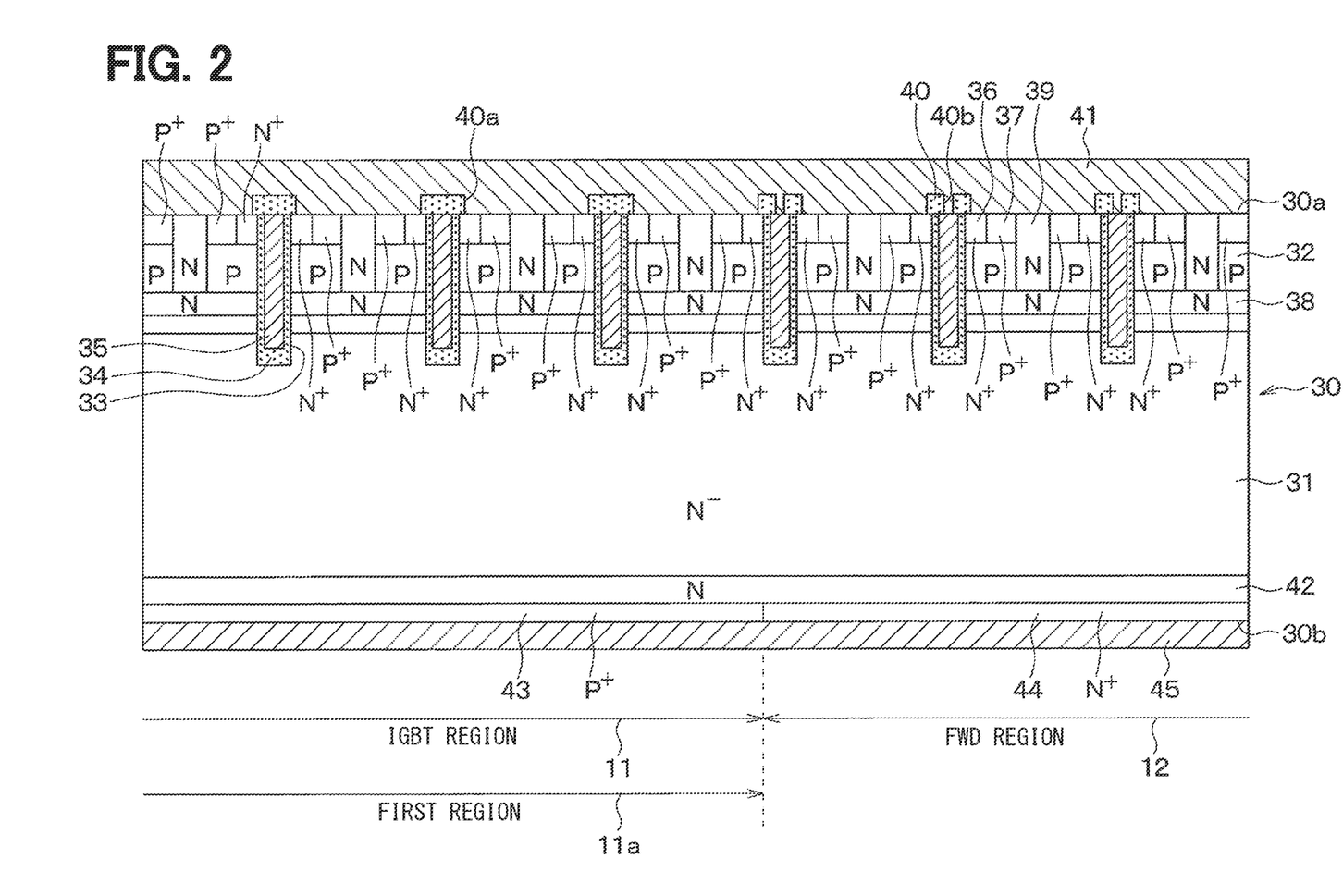
FIG. 2 is a cross-sectional view of the semiconductor device taken along a line II-II in FIG. 1.
Figure 3:
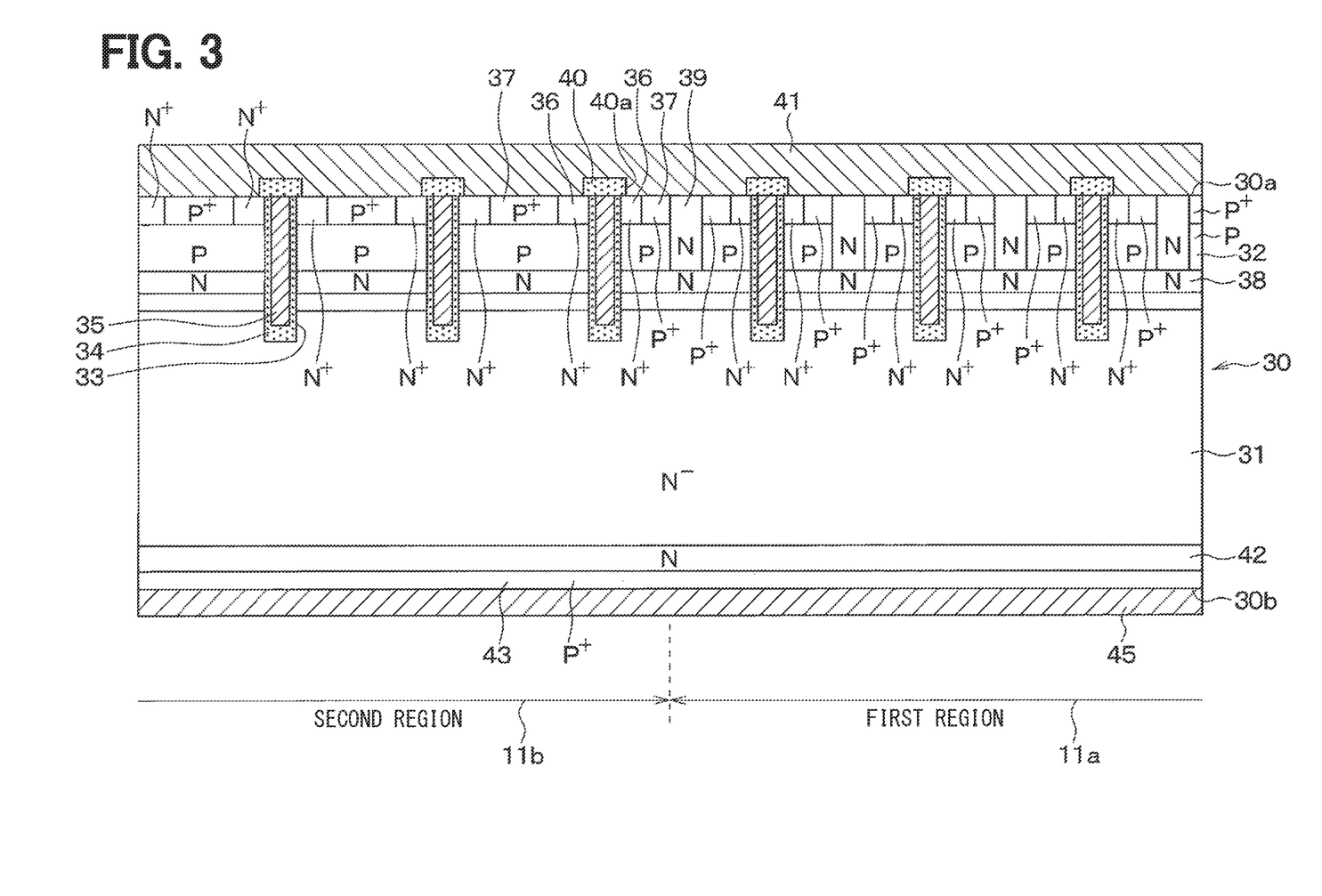
FIG. 3 is a cross-sectional view of the semiconductor device taken along a line III-III in FIG. 1.

As shown in FIGS. 2 and 3, the semiconductor device has a semiconductor substrate 30 including an N⁻ type drift layer 31. In the present embodiment, the semiconductor substrate 30 is made of a silicon substrate, and a thickness, which is a length between a first surface 30a and a second surface 30b, is 120 μm. That is, the thickness of the semiconductor substrate 30 is thinner than the width of each of the FWD regions 12. On the drift layer 31, a P type base layer 32 is formed. In other words, the base layer 32 is formed to the first surface 30a of the semiconductor substrate 30. Multiple trenches 13 are provided in the semiconductor substrate 30 so as to penetrate through the base layer 32 and reach the drift layer 31. Accordingly, the base layer 32 is divided into multiple pieces by the trenches 13. In the present embodiment, the trenches 33 are formed in each of the IGBT regions 11 and the FWD regions 12. In the present embodiment, the trenches 33 are formed in a striped shape with the direction intersecting the arrangement direction of the IGBT regions 11 and the FWD regions 12 (that is, the left-right direction on the paper surface in FIG. 1) as the longitudinal direction. The distance between adjacent two of the trenches 33 (that is, a pitch distance) is, for example, about 6 μm.

Each of the trenches 33 is embedded with a gate insulating film 34 and a gate electrode 35. The gate insulating film 34 covers a wall surface of each of the trenches 33. The gate electrode 35 is formed of polysilicon or the like and is formed on the gate insulating film 34. Accordingly, a trench gate structure is formed.

The gate electrode 35 arranged in the trench 33 formed in the IGBT region 11 is connected to a gate pad or the like formed in the outer peripheral region 20 via a gate wiring (not shown). The gate pad is connected to a drive circuit via a variable resistor (not shown). Then, a predetermined pulsed gate voltage is applied to the gate electrode 35. The gate electrode 35 arranged in the trench 33 formed in the FWD region 12 is electrically connected to an upper electrode 41 described later and is maintained at a predetermined potential.

In a surface layer portion of the base layer 32, N⁺ type emitter regions 36 having a higher impurity concentration than the drift layer 31 is formed. That is, the emitter regions 36 are formed to the first surface 30a of the semiconductor substrate 30. Further, P⁺ type contact regions 37 having a higher impurity concentration than the base layer 32 are formed in the surface layer portion of the base layer 32. The emitter regions 36 are formed so as to terminate in the base layer 32 and to be in contact with side surfaces of the trenches 33, respectively. Further, the contact regions 37 are formed so as to terminate in the base layer 32, similarly to the emitter regions 36.

More specifically, the emitter regions 36 extend in a bar shape along the longitudinal direction of the trenches 33 so as to be in contact with the side surfaces of the trenches 33 in regions between adjacent two of the trenches 33, and terminate at positions shallower than bottoms of the trenches 33. Further, the contact regions 37 extend in a bar shape along the longitudinal direction of the trenches 33 so as to be in contact with the emitter region 36, respectively.

In the present embodiment, a portion of the wall surface of each of the trenches 33 located between the emitter region 36 and the drift layer 31 corresponds to a surface of the base layer 32 located between the emitter region 36 and the drift layer 31. In FIGS. 2 and 3, the contact regions 37 are illustrated to have the same depth as the emitter regions 36, but the contact regions 37 may be formed deeper than the emitter regions 36. Further, in the present embodiment, the base layer 32 is formed with N⁻ type barrier regions 38 having a higher impurity concentration than the drift layer 31, so that the base layer 32 is divided in the depth direction of the trenches 33.

In each of the IGBT regions 11 and the FWD regions 12, N⁻ type pillar regions 39 are formed in the base layer 32 from the first surface 30a of the semiconductor substrate 30 so as to reach the barrier regions 38. The pillar regions 39 have substantially the same impurity concentration as the barrier regions 38, and extend along the extending direction of the trenches 33.

Here, a region of each of the IGBT regions 11 close to the FWD region 12 is referred to as a first region 11a, and a region of each of the IGBT regions 11 different from the first region 11a is referred to as a second region 11b. In the present embodiment, since the IGBT regions 11 and the FWD regions 12 are arranged as described above, in the IGBT region 11 sandwiched by the FWD regions 12, the second region 11b is sandwiched by the first regions 11a. Further, in the IGBT region 11 located at each end in the arrangement direction of the IGBT regions 11 and the FWD regions 12, an entire region close to the end in the arrangement direction is the second region 11b.

In each of the FWD regions 12, the pillar regions 39 are formed in an entire region. On the other hand, in each of the IGBT regions 11, the pillar regions 39 are formed only in the first region 11a, and the pillar regions 39 are not formed in the second region 11b. That is, in each of the IGBT regions 11, a region with the pillar regions 39 and a region without the pillar region 39 are mixed. In other words, each of the IGBT regions 11 has a configuration in which the pillar regions 39 are thinned out.

In the present embodiment, the barrier regions 38 and the pillar regions 39 correspond to carrier extraction portions. Further, in the present embodiment, the first region 11a extends to an opposite side portion of the pillar region 39 located farthest from a boundary with the FWD region 12, and the opposite side portion is a side portion of the pillar region 39 located opposite from the boundary. That is, a width of the first region 11a, which will be described later, is a length between the boundary with the FWD region 12 and the opposite side portion of the pillar region 39 located farthest from the boundary. On the first surface 30a of the semiconductor substrate 30, an interlayer insulating film 40 made of borophosphosilicate glass (BPSG) or the like is formed. On the interlayer insulating film 40, the upper electrode 41 is formed. The upper electrode 41 is electrically connected to the emitter regions 36, the contact regions 37 (that is, the base layer 32), and the pillar regions 39 through contact holes 40a provided in the interlayer insulating film 40. That is, on the interlayer insulating film 40, the upper electrode 41 that functions as an emitter electrode in the IGBT regions 11 and functions as an anode electrode in the FWD regions 12 is formed. The upper electrode 41 may be brought into ohmic contact with the base layer 32, the contact regions 37, and the pillar regions 39. Alternatively, the upper electrode 41 may be brought into ohmic contact with the base layer 32 and the contact regions 37 and may be brought into Schottky contact with the pillar regions 39.

Further, in the present embodiment, the interlayer insulating film 40 has contact holes 40b that expose the gate electrodes 35 in the FWD regions 12. The upper electrode 41 is also connected to the gate electrodes 35 through the contact holes 40b. As a result, the gate electrodes 35 formed in the FWD regions 12 are maintained at the same potential as the upper electrode 41. In the present embodiment, the upper electrode 41 corresponds to a first electrode.

On a side of the drift layer 31 opposite from the base layer 32 (that is, a side close to the second surface 30b of the semiconductor substrate 30), an N type buffer layer 42 having a higher impurity concentration than the drift layer 31 is formed.

Then, in each of the IGBT regions 11, a P$^+$ type collector layer 43 is formed on a side opposite from the drift layer 31 across the buffer layer 42, and in each of the FWD regions 12, an N$^+$ type cathode layer 44 is formed on a side opposite from the drift layer 31 across the buffer layer 42. That is, the IGBT regions 11 and the FWD regions 12 are distinguished from each other depending on whether the layer formed on the second surface 30b of the semiconductor substrate 30 is the collector layer 43 or the cathode layer 44. A region above the collector layer 43 is defined as the IGBT region 11, and a region above the cathode layer 44 is defined as the FWD region 12.

On the side opposite from the drift layer 31 across the collector layer 43 and the cathode layer 44 (that is, on the second surface 30b of the semiconductor substrate 30), a lower electrode 45 is formed to be electrically connected to the collector layer 43 and the cathode layer 44. In other words, the lower electrode 45 functioning as a collector electrode in the IGBT region 11 and a cathode electrode in the FWD region 12 is formed. In the present embodiment, the lower electrode 45 is brought into ohmic contact with the collector layer 43 and the cathode layer 44. Further, in the present embodiment, the lower electrode 45 corresponds to a second electrode.

With the configuration described above, in the FWD regions 12, the FWD element are formed by PN junction with the base layer 32 and the contact regions 37 as anodes and the drift layer 31, the buffer layer 42, and the cathode layer 44 as cathodes.

The configuration of the semiconductor device according to the present embodiment has been described above. In the present embodiment, the N type, the N$^+$ type, and the N$^-$ type correspond to a first conductive type, and the P type and P$^+$ type correspond to a second conductive type. Further, in the present embodiment, the semiconductor substrate 30 has a structure including the collector layer 43, the cathode layer 44, the drift layer 31, the emitter regions 36, the contact regions 37, the barrier regions 38, and the pillar regions 39.

Next, while explaining the operation of the semiconductor device, the detailed configuration of the semiconductor device will be further described.

In the IGBT elements formed in the IGBT regions 11, a gate voltage is applied to the gate electrodes 35 to control the presence or absence of channels formed in portions of the base layer 32 being in contact with the trenches 33. Accordingly, the IGBT elements perform switching operation in which a current flows or is cut off between the emitter and the collector.

Figure 4:
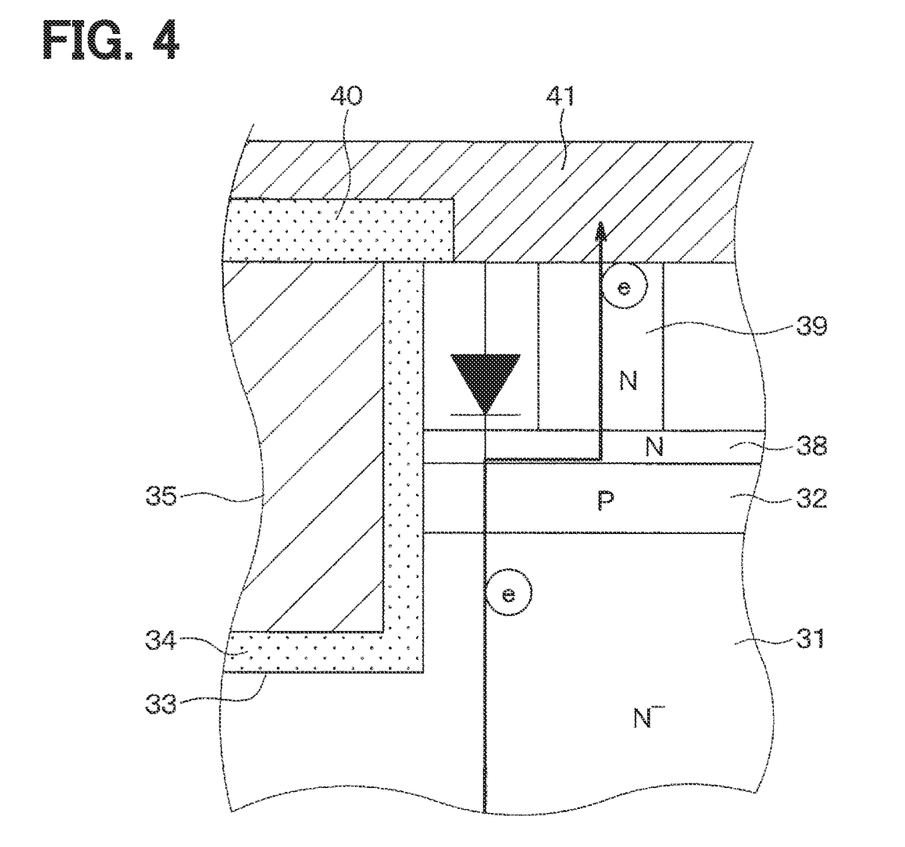
FIG. 4 is a schematic diagram showing the flow of electrons when an FWD element is operated as a diode.

The FWD elements formed in the FWD regions 12 are operated as diodes when electrons are injected from the lower electrode 45 into the cathode layer 44, and holes are injected from the lower electrode 45 to the contact regions 37 by applying a forward bias between the upper electrode 41 and the lower electrode 45. In the present embodiment, the pillar regions 39 are formed in the FWD regions 12 and the first regions 11a of the IGBT regions 11. Therefore, as shown in FIG. 4, the electrons injected from the lower electrode 45 escape from the pillar regions 39 to the upper electrode 41 in a low resistance state. Therefore, the forward bias is restricted from being applied to the PN junctions between the barrier regions 38 and the pillar regions 39 and the base layer 32, and the injection of holes from the upper electrode 41 can be reduced. In FIG. 4, the electron is shown as "e".

Therefore, when the voltage between the upper electrode 41 and the lower electrode 45 is switched from the forward bias to the reverse bias, the injection of holes is suppressed, so that a recovery current can be reduced and a recovery time can be shortened. Therefore, a switching loss can be reduced. In the present embodiment, electrons correspond to carriers injected from the second electrode.

Figure 5:
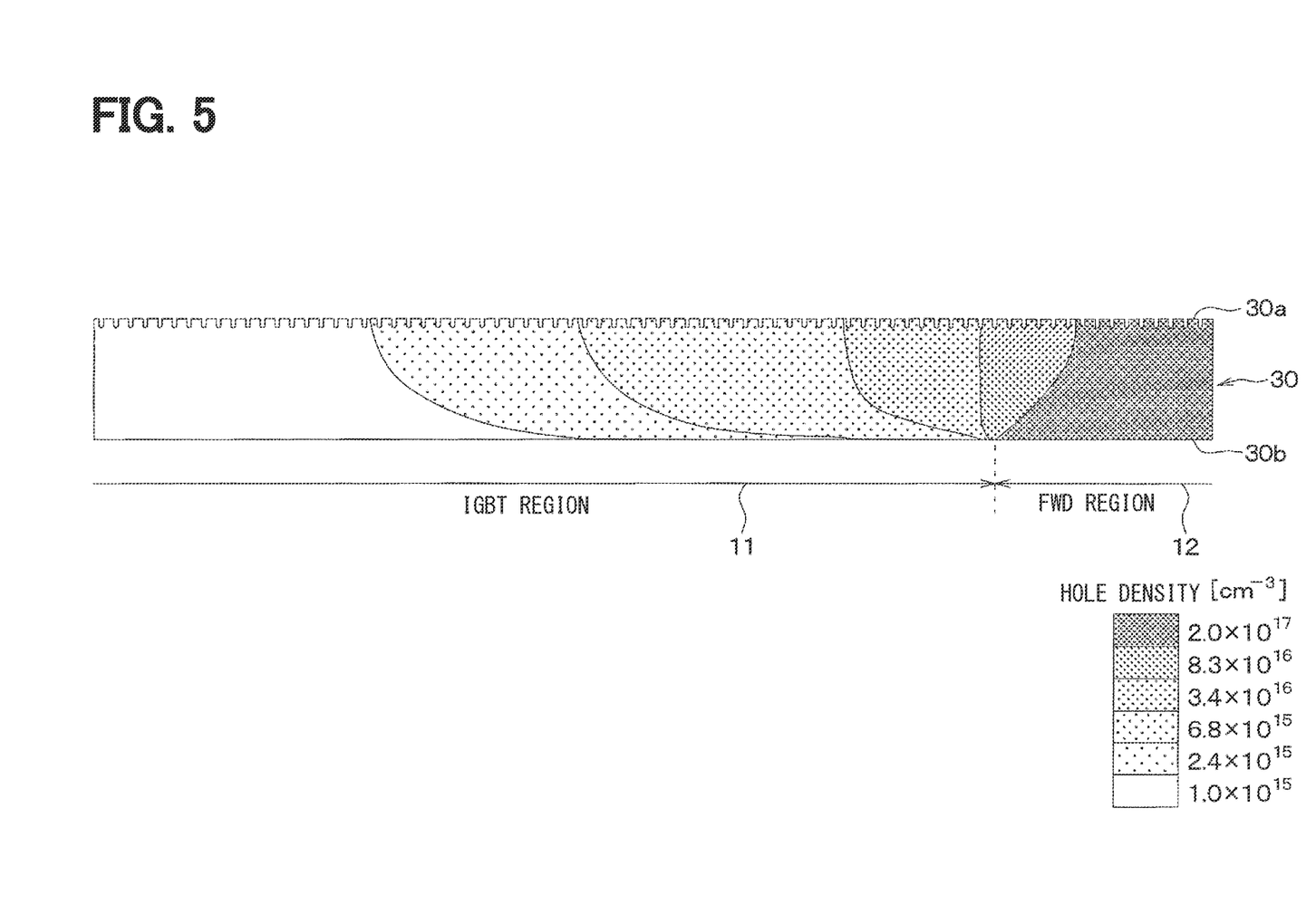
FIG. 5 is a diagram showing a simulation result regarding a hole density when the FWD element is operated as the diode.
Figure 6:
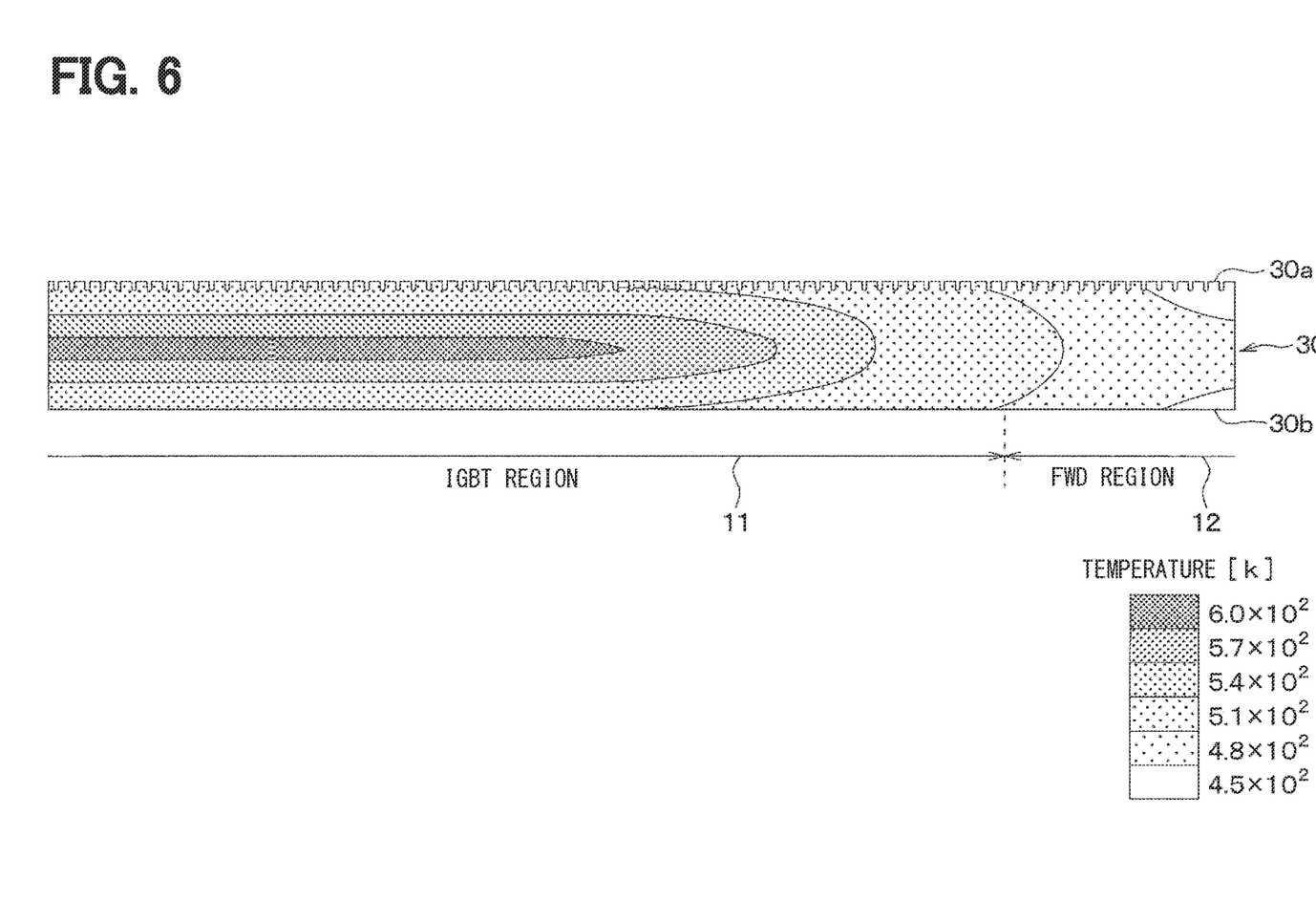
FIG. 6 is a diagram showing a simulation result regarding a temperature distribution immediately after a short-circuit current is cut off.

The following describes results obtained by the present inventors on a semiconductor device according to a comparative example with reference to FIG. 5 and FIG. 6. In the semiconductor device according to the comparative example, the pillar regions 39 are formed over the entire region of the IGBT regions 11 and the FWD regions 12.

First, as shown in FIG. 5, it is confirmed that the hole density increases in the FWD region 12 when the semiconductor device is operated as the diode. Then, in the IGBT region 11, if a side opposite from the boundary with the FWD region 12 is defined as a center side in the width direction of the IGBT region 11 (hereinafter, also simply referred to as the center side), it is confirmed that the hole density decreases from the boundary with the FWD region 12 to the center side. This is because during the diode operation, the electrons injected into the cathode layer 44 (that is, the second surface 30b of the semiconductor substrate 30) move while diffusing toward the first surface 30a with a spread of about 45 degrees. That is, in the IGBT region 11, it is difficult for electrons to reach a portion at a distance equal to or more than the thickness of the semiconductor substrate 30 from the boundary with the FWD region 12, and it is difficult for holes to be injected.

Further, as shown in FIG. 6, it is confirmed that immediately after the semiconductor device is short-circuited and a short-circuit current, which is a large current, flows in the IGBT region 11 and the short-circuit is cut off, the temperature distribution increases from the boundary with the FWD region 12 to the center side. This is because, in a region of the IGBT region 11 adjacent to the boundary with the FWD region 12, the heat generated by the flow of the large current is dissipated toward the FWD region 12.

Figure 7:
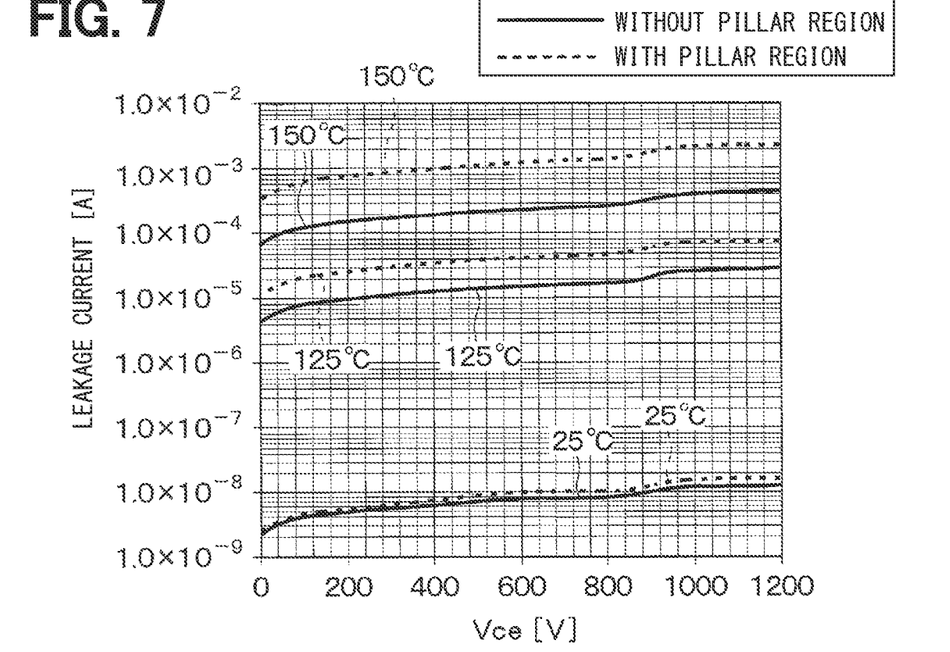
FIG. 7 is a diagram showing a simulation result regarding a relationship between a leakage current and the presence or absence of pillar regions.

Furthermore, the present inventors diligently investigated the relationship between the leakage current and the presence or absence of the pillar regions 39, and obtained the results shown in FIG. 7.

As shown in FIG. 7, the leakage current increases as the temperature rises because electrons are more likely to escape to the upper electrode 41. It is confirmed that, when the pillar regions 39 are formed, electrons are more likely to escape to the upper electrode 41 and the leakage current is more likely to increase than when the pillar regions 39 are not formed. That is, in the semiconductor device, when a short circuit occurs, the temperature of the center region of the IGBT region 11 tends to be higher than the temperature of the region adjacent to the boundary with the FWD region 12. Thus, when the pillar regions 39 are formed in the center region, the leakage current increases, and the short-circuit tolerance tends to decrease. Therefore, when the pillar regions 39 are formed over the entire region of the IGBT region 11 and the FWD region 12 as in the semiconductor device according to the comparative example, the short-circuit tolerance is lowered.

Therefore, in the semiconductor device of the present embodiment, in the IGBT region 11, the pillar regions 39 are formed in the first region 11a adjacent to the FWD region 12, and the pillar regions 39 are not formed in the second region 11b different from the first region 11a. Therefore, the short-circuit tolerance can be improved while reducing the switching loss.

Figure 8:
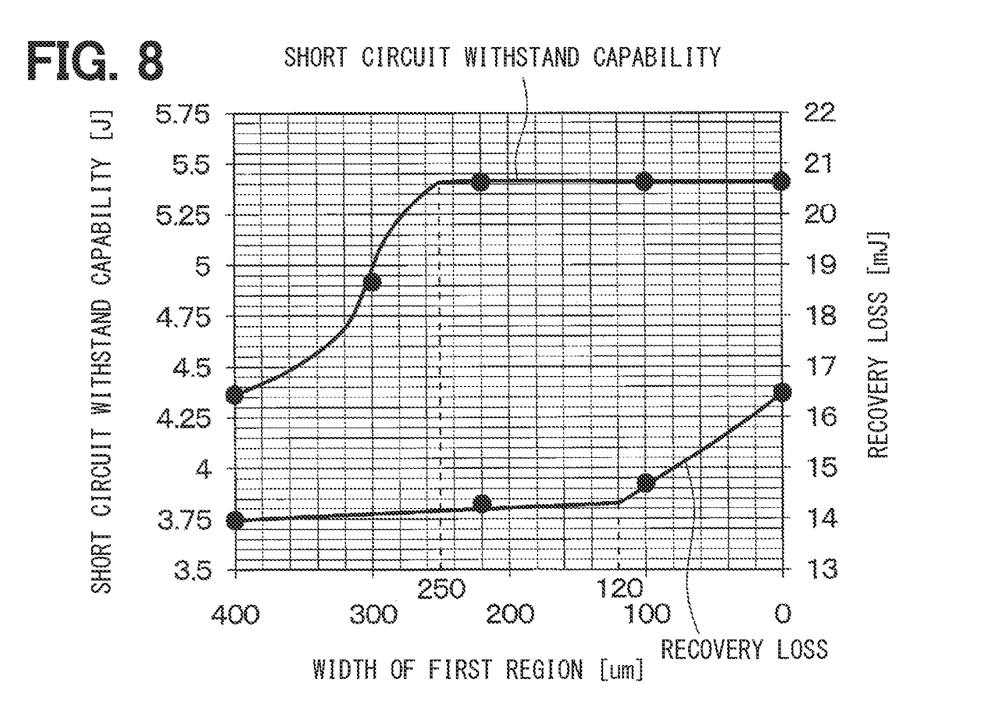
FIG. 8 is a diagram showing an experimental result regarding a relationship between a width of a first region and a short-circuit tolerance.

Then, the present inventors further diligently investigated the width of the first region 11a, and obtained the experimental results shown in FIG. 8. FIG. 8 is a diagram showing experimental results in which the thickness of the semiconductor substrate 30 is 120 μm and the width of the FWD region 12 is 250 μm. Further, in FIG. 8, the boundary between the IGBT region 11 and the cathode layer 44 is used as a reference (that is, the width of the first region in FIG. 8 is 0).

As shown in FIG. 8, the recovery loss (that is, the switching loss) sharply decreases up to the width of the first region 11a of 120 μm, but does not change much in the range of 120 μm or more. That is, when the thickness of the semiconductor substrate 30 is 120 μm, the recovery loss does not change much even if the width of the first region 11a is equal to or larger than the thickness of the semiconductor substrate 30.

On the other hand, the short-circuit tolerance is substantially constant until the width of the first region 11a is 250 μm, but decreases sharply when the width of the first region 11a is 250 μm or more. That is, when the width of the FWD region 12 is 250 μm, the short-circuit tolerance decreases sharply when the width of the first region 11a is equal to or larger than the width of the FWD region 12.

Therefore, in the present embodiment, the width of the first region 11a is set to be equal to or larger than the thickness of the semiconductor substrate 30 and equal to or smaller than the width of the FWD region 12.

As described above, in the present embodiment, the pillar regions 39 are formed in the FWD region 12. Further, the IGBT region 11 has the first region 11a in which the pillar regions 39 are formed and the second region 11b in which the pillar regions 39 are not formed. Therefore, the switching loss can be reduced by the FWD region 12 and the first region 11a in which the pillar regions 39 are formed. Further, the second region 11b without the pillar region 39 can suppress a decrease in the short-circuit tolerance.

In the present embodiment, the first region 11a is formed adjacent to the boundary with the FWD region 12. Further, the width of the first region 11a is equal to or larger than the thickness of the semiconductor substrate 30 and equal to or smaller than the width of the FWD region 12. Therefore, it is possible to suppress the decrease in short-circuit tolerance while sufficiently reducing the switching loss.

Second Embodiment

A second embodiment will be described. In the present embodiment, the configuration of the IGBT region 11 is changed from that of the first embodiment. The other configurations are the same as those of the first embodiment, and therefore a description of the same configurations will be omitted below.

Figure 9:
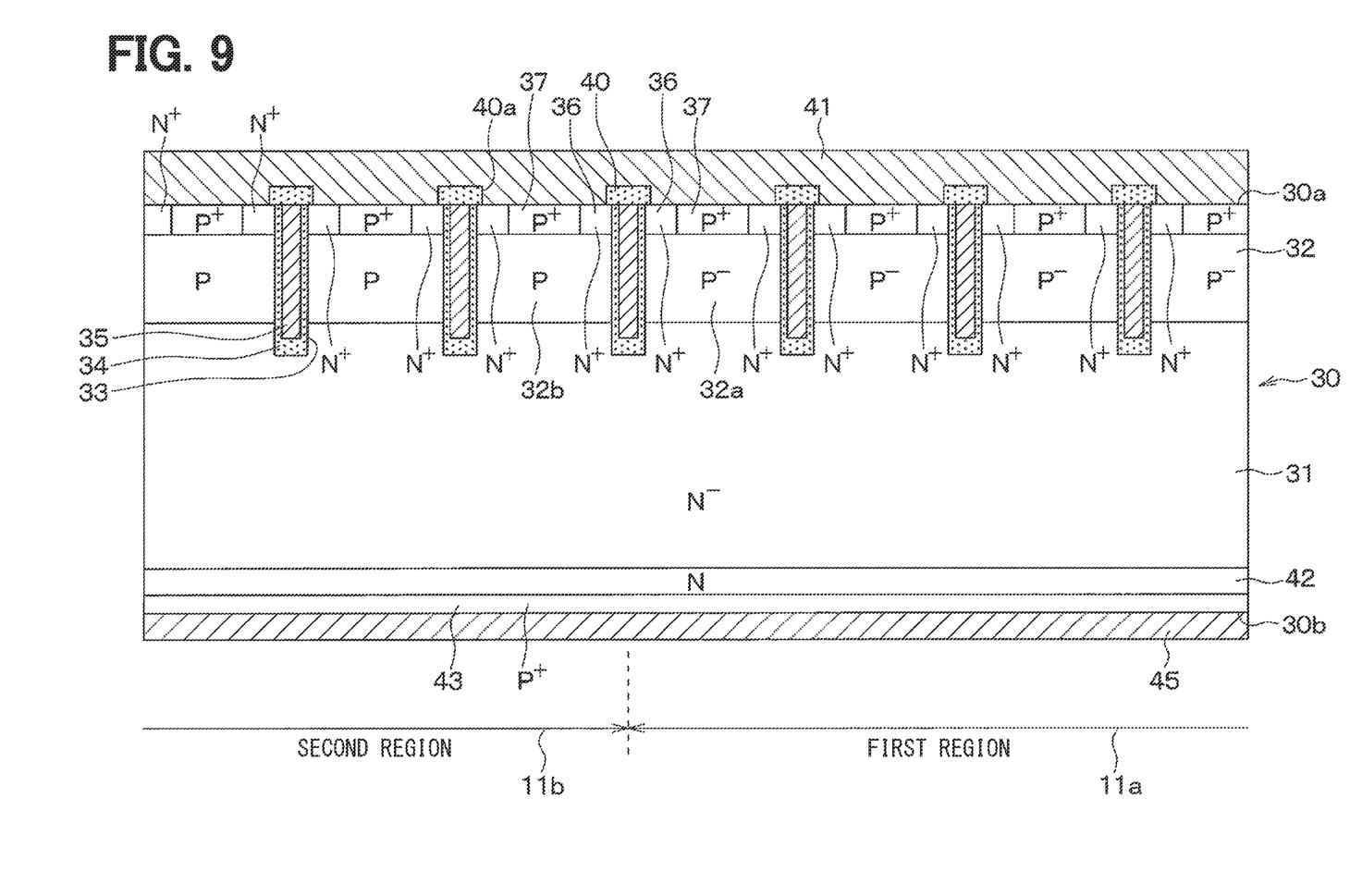
FIG. 9 is a cross-sectional view of a semiconductor device according to a second embodiment.

In the present embodiment, as shown in FIG. 9, the barrier regions 38 and the pillar regions 39 are not formed. The base layer 32 has a first base layer 32a located in the first region 11a and a second base layer 32b located in the second region 11b. The first base layer 32a has a lower impurity concentration than the second base layer 32b. Although not particularly shown, the configuration of the semiconductor substrate 30 adjacent to the first surface 30a in the FWD region 12 is the same as that of the first region 11a.

As described above, even in a semiconductor device in which extraction of electrons to the upper electrode 41 is facilitated by changing the impurity concentration of the base layer 32, effects similar to the effects of the first embodiment can be obtained. In the present embodiment, the first base layer 32a corresponds to a carrier extraction portion.

Other Embodiments

Although the present disclosure has been described in accordance with the embodiments, it is understood that the present disclosure is not limited to such embodiments or structures. The present disclosure encompasses various modifications and variations within the scope of equivalents. Furthermore, various combinations and aspects, and other combination and aspect including only one element, more than one element or less than one element, are also within the sprit and scope of the present disclosure.

For example, in each of the above-described embodiments, the example is described in which the first conductive type is N type and the second conductive type is P type. Alternatively, the first conductive type may be P type and the second conductive type may be N type.

In each of the above embodiments, instead of the trench gate type semiconductor device, a planar type semiconductor device in which the gate electrodes 35 are arranged on the first surface 30a of the semiconductor substrate 30 may be used.

Further, in each of the above-described embodiments, the number of the cell region 10 may be one, or may be three or more. Further, the number of the FWD region 12 formed in one cell region 10 may be one.

In each of the above-described embodiments, the first region 11a does not have to be formed to be adjacent to the FWD region 12. The width of the first region 11a may be smaller than the thickness of the semiconductor substrate 30, or may be wider than the width of the FWD region 12. Even in such a semiconductor device, by configuring the IGBT region 11 to have the first region 11a and the second region 11b, it is possible to suppress the decrease in short-circuit tolerance while reducing the switching loss.

In the first embodiment, although not particularly shown, the barrier regions 38 may be arranged between the drift layer 31 and the base layer 32. In the first embodiment, although not particularly shown, the barrier regions 38 may omitted and the carrier extraction portion may be composed of only the pillar regions 39. In the first embodiment, extraction of the carriers may be facilitated by changing the impurity concentration of the pillar regions 39. In the present case, for example, the pillar regions 39 formed in the first region 11a may have a higher impurity concentration than the pillar regions 39 formed in the second region 11b.

In the first embodiment, the contact regions 37 may be omitted or may be formed apart from the pillar regions 39. That is, the semiconductor device may be configured such that the base layer 32 is exposed from the first surface 30a of the semiconductor substrate 30.

In the first and second embodiments, the IGBT region 11 and the FWD region 12 do not have to be arranged adjacent to each other. For example, a region such as a connecting region may be arranged between the IGBT region 11 and the FWD region 12.

What is claimed is:

1. A semiconductor device having an insulated gate bipolar transistor (IGBT) region in which an IGBT element is formed and a free wheel diode (FWD) region in which an FWD element is formed, the semiconductor device comprising:
    a semiconductor substrate including:
        a drift layer of a first conductivity type;
        a base layer of a second conductivity type disposed in a surface layer portion of the drift layer;
        an emitter region of the first conductivity type disposed in a surface layer portion of the base layer in the IGBT region to be apart from the drift layer, the emitter region having a higher impurity concentration than the drift layer;
        a collector layer of the second conductivity type disposed on a side of the drift layer opposite from the base layer in the IGBT region; and
        a cathode layer of the first conductivity type disposed on the side of the drift layer opposite from the base layer in the FWD region;
    a gate insulating film disposed on a surface of the base layer located between the emitter region and the drift layer;
    a gate electrode disposed on the gate insulating film;
    a first electrode electrically connected to the base layer and the emitter region; and
    a second electrode electrically connected to the collector layer and the cathode layer, wherein
    the IGBT region and the FWD region are arranged in one direction as an arrangement direction,
    the IGBT region has a first region disposed adjacent to the FWD region in the arrangement direction, and a second region different from the first region and disposed on a side of the first region opposite from the FWD region in the arrangement direction,
    each of the first region and the second region includes the drift layer, the base layer, the emitter region, the collector layer, the gate insulating film, the gate electrode, the first electrode, and the second electrode, and
    each of the FWD region and the first region of the IGBT region has a carrier extraction portion that facilitates extraction of carriers injected from the second electrode compared to the second region when a forward bias for causing the FWD element to operate as a diode is applied between the first electrode and the second electrode.

2. The semiconductor device according to claim 1, wherein
    a length in the arrangement direction is defined as a width, and
    a width of the first region of the IGBT region is equal to or larger than a thickness of the semiconductor substrate.

3. The semiconductor device according to claim 1, wherein
    a length in the arrangement direction is defined as a width, and
    a width of the first region of the IGBT region is equal to or smaller than a width of the FWD region.

4. The semiconductor device according to claim 1, wherein
    the carrier extraction portion includes:
        a barrier region of the first conductivity type disposed between the base layer and the drift layer, or disposed inside the base layer; and
        a pillar region of the first conductivity type disposed in the base layer and connected to the barrier region and the first electrode.

5. The semiconductor device according to claim 1, wherein
    the carrier extraction portion includes a pillar region of the first conductivity type extending along an extending direction of the gate electrode,
    each of the FWD region and the first region of the IGBT region includes the pillar region, and
    the second region of the IGBT region does not include the pillar region.

* * * * *